(12) United States Patent
Yu et al.

(10) Patent No.: US 11,043,593 B2
(45) Date of Patent: Jun. 22, 2021

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Cheng-Yen Yu, New Taipei (TW);
Che-Cheng Chang, New Taipei (TW);
Tung-Wen Cheng, New Taipei (TW);
Zhe-Hao Zhang, Hsinchu (TW);
Bo-Feng Young, Taipei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/594,237

(22) Filed: Oct. 7, 2019

(65) Prior Publication Data
US 2020/0035832 A1 Jan. 30, 2020

Related U.S. Application Data

(60) Continuation of application No. 16/056,148, filed on Aug. 6, 2018, now Pat. No. 10,483,394, which is a
(Continued)

(51) Int. Cl.
*H01L 29/78* (2006.01)
*H01L 29/165* (2006.01)
(Continued)

(52) U.S. Cl.
CPC ...... *H01L 29/7848* (2013.01); *H01L 21/0262* (2013.01); *H01L 21/02529* (2013.01);
(Continued)

(58) Field of Classification Search
None
See application file for complete search history.

(56) References Cited

U.S. PATENT DOCUMENTS

| 8,058,692 B2 | 11/2011 | Lai et al. |
| 8,487,378 B2 | 7/2013 | Goto et al. |
(Continued)

FOREIGN PATENT DOCUMENTS

| CN | 105097522 A | 11/2015 |
| KR | 10-2010-0080449 A | 7/2010 |
| KR | 10-2014-0122096 A | 10/2014 |

OTHER PUBLICATIONS

Non-Final Office Action U.S. Appl. No. 14/749,597, filed May 11, 2016.
(Continued)

*Primary Examiner* — Whitney Moore
(74) *Attorney, Agent, or Firm* — McDermott Will & Emery LLP

(57) ABSTRACT

A semiconductor device includes a Fin FET device. The Fin FET device includes a first fin structure extending in a first direction and protruding from an isolation insulating layer, a first gate stack including a first gate electrode layer and a first gate dielectric layer, covering a portion of the first fin structure and extending in a second direction perpendicular to the first direction, and a first source and a first drain, each including a first stressor layer disposed over the first fin structure. The first fin structure and the isolation insulating layer are disposed over a substrate. A height Ha of an interface between the first fin structure and the first stressor layer measured from the substrate is greater than a height Hb of a lowest height of the isolation insulating layer measured from the substrate.

20 Claims, 26 Drawing Sheets

Related U.S. Application Data continuation of application No. 15/402,398, filed on Jan. 10, 2017, now Pat. No. 10,043,906, which is a division of application No. 14/749,597, filed on Jun. 24, 2015, now Pat. No. 9,564,528.

(60) Provisional application No. 62/104,066, filed on Jan. 15, 2015.

(51) Int. Cl.
| | | |
|---|---|---|
| *H01L 21/02* | (2006.01) | |
| *H01L 21/84* | (2006.01) | |
| *H01L 27/12* | (2006.01) | |
| *H01L 21/8238* | (2006.01) | |
| *H01L 27/092* | (2006.01) | |
| *H01L 29/66* | (2006.01) | |
| *H01L 29/267* | (2006.01) | |

(52) U.S. Cl.
CPC .............. *H01L 21/02532* (2013.01); *H01L 21/823807* (2013.01); *H01L 21/823814* (2013.01); *H01L 21/823821* (2013.01); *H01L 21/845* (2013.01); *H01L 27/0924* (2013.01); *H01L 27/1211* (2013.01); *H01L 29/165* (2013.01); *H01L 29/66795* (2013.01); *H01L 29/785* (2013.01); *H01L 29/267* (2013.01)

(56) References Cited

U.S. PATENT DOCUMENTS

| | | |
|---|---|---|
| 8,729,634 B2 | 5/2014 | Shen et al. |
| 8,826,213 B1 | 9/2014 | Ho et al. |
| 8,887,106 B2 | 11/2014 | Ho et al. |
| 9,153,692 B2 | 10/2015 | Kim et al. |
| 9,202,919 B1 | 12/2015 | Liu et al. |
| 2009/0026530 A1 | 1/2009 | Wilson et al. |
| 2010/0006974 A1 | 1/2010 | Ku et al. |
| 2013/0285143 A1* | 10/2013 | Oh ............... H01L 27/0924 257/347 |
| 2014/0070316 A1 | 3/2014 | Chan et al. |
| 2014/0191358 A1 | 7/2014 | Liou et al. |
| 2014/0282326 A1 | 9/2014 | Chen et al. |
| 2014/0374827 A1 | 12/2014 | Suh et al. |
| 2014/0374837 A1 | 12/2014 | Ichikawa |
| 2015/0140759 A1* | 5/2015 | Jeong ............ H01L 29/66636 438/283 |
| 2015/0162332 A1 | 6/2015 | Kim et al. |
| 2015/0270401 A1 | 9/2015 | Huang et al. |

OTHER PUBLICATIONS

Notice of Allowance U.S. Appl. No. 14/749,597 dated Sep. 21, 2016.
Office Action Korean Patent Application No. 10-2015-0146603 dated Aug. 30, 2016 with English translation.
Office Action Taiwanese Patent Application No. 10521512510 dated Dec. 8, 2016.
Chinese Office Action issued in corresponding Chinese Patent Application No. 201610023757.1, dated Apr. 2, 2018.
Notice of Allowance issued in corresponding U.S. Appl. No. 16/056,148, dated Jul. 10, 2019.
Notice of Allowance issued in related U.S. Appl. No. 16/056,148, dated Jul. 10, 2019.

* cited by examiner

SEMICONDUCTOR DEVICE AND MANUFACTURING METHOD THEREOF

RELATED APPLICATIONS

This application is a Continuation Application of U.S. Ser. No. 16/056,148 filed Aug. 6, 2018, which is a Continuation Application of U.S. Ser. No. 15/402,398 filed Jan. 10, 2017, now U.S. Pat. No. 10,043,906, which is a Divisional Application of U.S. Ser. No. 14/749,597 filed Jun. 24, 2015, now U.S. Pat. No. 9,564,528, which claims priority of U.S. Provisional Application No. 62/104,066 filed on Jan. 15, 2015, the entire contents of each of which is incorporated herein by reference.

TECHNICAL FIELD

The disclosure relates to a semiconductor integrated circuit, more particularly to a semiconductor device having a fin structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET). Fin FET devices typically include semiconductor fins with high aspect ratios and in which channel and source/drain regions of semiconductor transistor devices are formed. A gate is formed over and along the sides of the fin structure (e.g., wrapping) utilizing the advantage of the increased surface area of the channel and source/drain regions to produce faster, more reliable and better-controlled semiconductor transistor devices. In some devices, strained materials in source/drain (S/D) portions of the FinFET utilizing, for example, silicon germanium (SiGe), silicon phosphide (SiP) or silicon carbide (SiC), may be used to enhance carrier mobility.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Figure 1A:
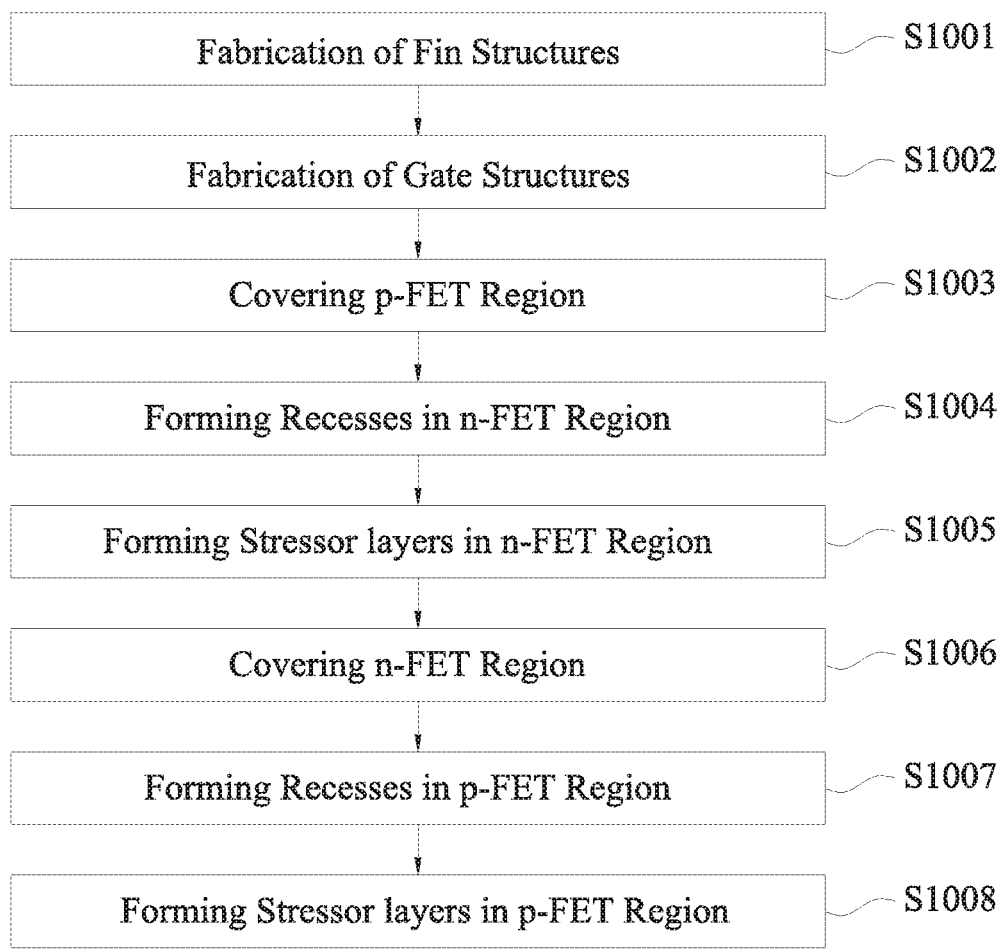
FIG. 1A is an exemplary process flow chart for manufacturing a semiconductor FET device having a fin structure (Fin FET)
Figure 1B:
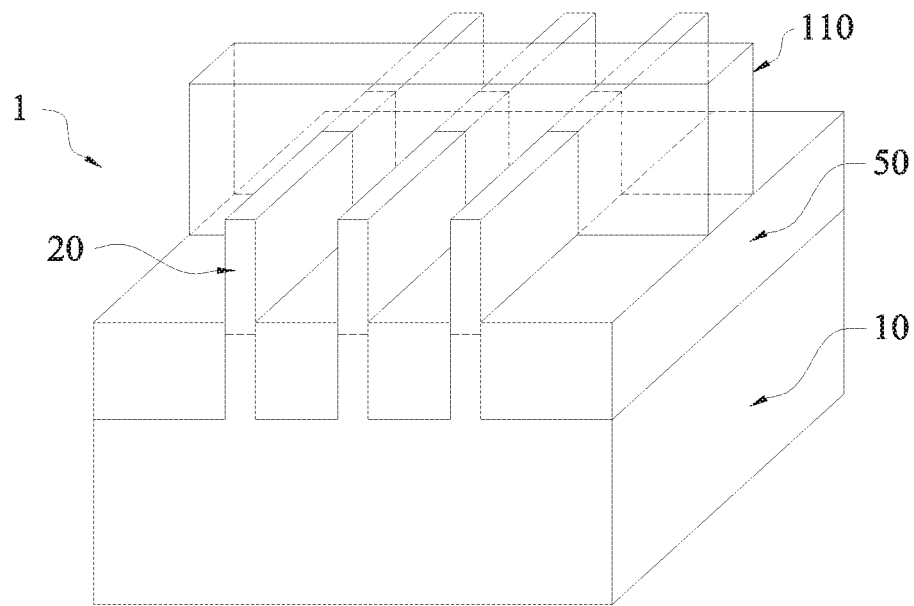
FIGS. 1B and 1C are exemplary perspective views of the Fin FET device according to one embodiment of the present disclosure.
Figure 1C:
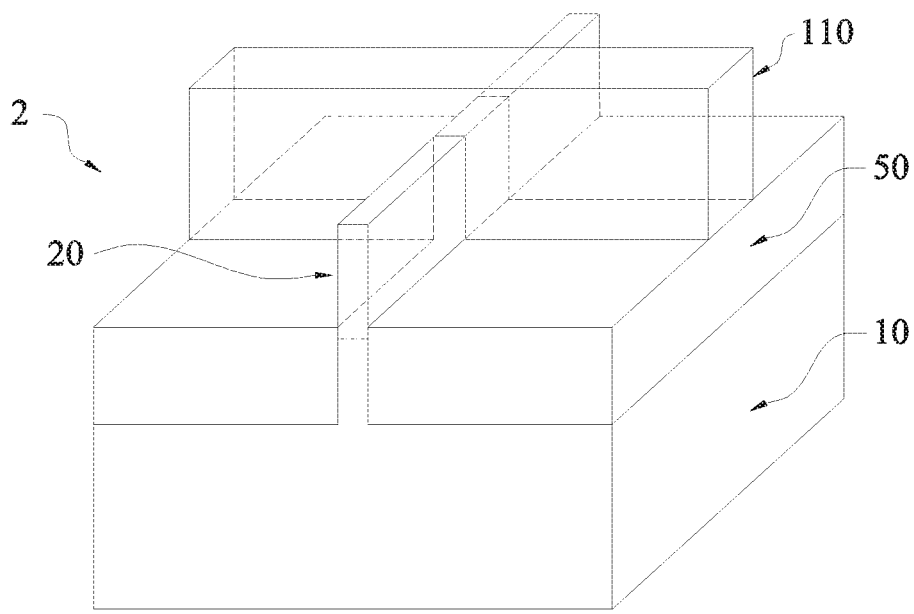

FIG. 1A is an exemplary flow chart for manufacturing a semiconductor FET device having a fin structure (Fin FET). FIGS. 1B and 1C are exemplary perspective views of the Fin FET device according to one embodiment of the present disclosure. As shown in FIGS. 1B and 1C, fin structures 20 protruding from an isolation insulating layer 50 are disposed over a substrate 10 and a gate structure 110 is formed over the fin structures. In FIG. 1B, a Fin FET device 1 includes plural fin structures, while in FIG. 1C, a Fin FET device 2 includes one fin structure.

The flow chart of FIG. 1A illustrates only a relevant part of the entire manufacturing process for a Fin FET device. It is understood that additional operations may be provided before, during, and after processes shown by FIG. 1A, and some of the operations described below can be replaced or eliminated, for additional embodiments of the method. The order of the operations/processes may be interchangeable. Further, the general operations for manufacturing a recessed S/D structure with strain materials (or stressor) in the fin structure are disclosed in U.S. Pat. No. 8,440,517, the entire contents of which are incorporated herein by reference.

In S1001, a fin structure is fabricated over a substrate. In S1002, a gate structure including a gate dielectric layer and a gate electrode is formed over a portion of the fin structure. In S1003, a region for a second type of FET, for example, a p-type FET, is covered by a covering layer to protect the region for the second type of FET from the subsequent processes for a first type of FET, for example an n-type FET. In S1004, the fin structure not covered by the gate structure is recessed. In S1005, a stressor layer is formed in the recessed portion of the fin structure. After forming the stressor structure for the first type of FET, in S1006, a region for the first type of FET is covered by a cover layer to protect the first type of FET with the stressor structure from the subsequent processes for the second type of FET. In S1007, the fin structure not covered by the gate structure for the second type of FET is recessed. In S1008, a stressor layer is formed in the recessed portion of the fin structure for the second type of FET. It is possible to process a p-type FET first and then process an n-type FET.

Referring to FIGS. 2-15B, the details of the exemplary manufacturing process of a Fin FET are described.

Figure 2:
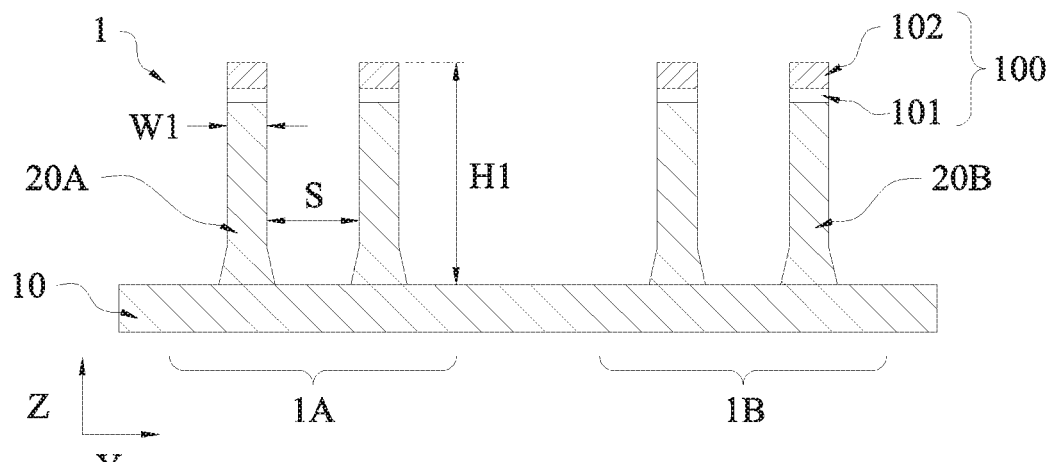
FIGS. 2-16 show exemplary processes for manufacturing the Fin FET device according to one embodiment of the present disclosure.

FIG. 2 is an exemplary cross sectional view of the Fin FET device 1 having a substrate 10 at one of the various stages of the fabrication process according to one embodiment.

To fabricate a fin structure, a mask layer is formed over the substrate 10 by, for example, a thermal oxidation process and/or a chemical vapor deposition (CVD) process. The substrate 10 is, for example, a p-type silicon substrate with an impurity concentration being in a range of about $1.12 \times 10^{15}$ cm$^{-3}$ and about $1.68 \times 10^{15}$ cm$^{-3}$. In other embodiments, The substrate 10 is an n-type silicon substrate with an impurity concentration being in a range of about $0.905 \times 10^{15}$ cm$^{-3}$ and about $2.34 \times 10^{15}$ cm$^{-3}$. The mask layer includes, for example, a pad oxide (e.g., silicon oxide) layer and a silicon nitride mask layer in some embodiments.

Alternatively, the substrate 10 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. When an SOI substrate is used, the fin structure may protrude from the silicon layer of the SOI substrate or may protrude from the insulator layer of the SOI substrate. In the latter case, the silicon layer of the SOI substrate is used to form the fin structure. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The pad oxide layer may be formed by using thermal oxidation or a CVD process. The silicon nitride mask layer may be formed by a physical vapor deposition (PVD), such as a sputtering method, a CVD, plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD), and/or other processes.

The thickness of the pad oxide layer is in a range of about 2 nm to about 15 nm and the thickness of the silicon nitride mask layer is in a range of about 2 nm to about 50 nm in some embodiments. A mask pattern is further formed over the mask layer. The mask pattern is, for example, a resist pattern formed by lithography operations.

By using the mask pattern as an etching mask, a hard mask pattern 100 of the pad oxide layer 101 and the silicon nitride mask layer 102 is formed. The width of the hard mask pattern 100 is in a range of about 5 nm to about 40 nm in some embodiments. In certain embodiments, the width of the hard mask patterns 100 is in a range of about 7 nm to about 12 nm.

As shown in FIG. 2, by using the hard mask pattern 100 as an etching mask, the substrate 10 is patterned into fin structures 20 by trench etching using a dry etching method and/or a wet etching method. A height H1 (in the Z direction) of the fin structure 20 is in a range of about 100 nm to about 300 nm. In certain embodiments, the height is in a range of about 50 nm to about 100 nm. When the heights of the fin structures are not uniform, the height from the substrate may be measured from the plane that corresponds to the average heights of the fin structures.

In this embodiment, a bulk silicon wafer is used as a starting material and constitutes the substrate 10. However, in some embodiments, other types of substrate may be used as the substrate 10. For example, a silicon-on-insulator (SOI) wafer may be used as a starting material, and the insulator layer of the SOI wafer constitutes the substrate 10 and the silicon layer of the SOI wafer is used for the fin structures 20.

As shown in FIG. 2, two fin structures 20 are disposed adjacent to each other in the Y direction in a first device region 1A and in a second device region 1B, respectively. However, the number of the fin structures is not limited to two. The numbers may be one, three, four or five or more. In addition, one of more dummy fin structures may be disposed adjacent to both sides of the fin structures 20 to improve pattern fidelity in patterning processes. The width W1 of the fin structure 20 is in a range of about 5 nm to about 40 nm in some embodiments, and may be in a range of about 7 nm to about 15 nm in certain embodiments. The height H1 of the fin structure 20 is in a range of about 100 nm to about 300 nm in some embodiments, and may be in a range of about 50 nm to 100 nm in other embodiments. The space S between the fin structures 20 is in a range of about 5 nm to about 80 nm in some embodiments, and may be in a range of about 7 nm to 15 nm in other embodiments. One skilled in the art will realize, however, that the dimensions and values recited throughout the descriptions are merely examples, and may be changed to suit different scales of integrated circuits.

In this embodiment, the first device region 1A is for n-type Fin FETs and the second device region 1B is for p-type Fin FETs.

Figure 3:
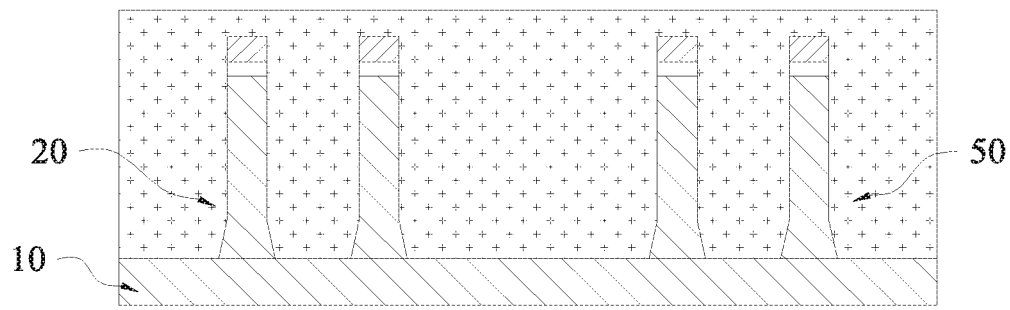

FIG. 3 is an exemplary cross sectional view of the Fin FET device 1 having fin structures 20 at one of the various stages of the fabrication process according to one embodiment.

As shown in FIG. 3, an isolation insulating layer 50 is formed over the substrate 10 so as to fully cover the fin structure 20.

The isolation insulating layer 50 includes one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once. The flowable film may be doped with boron and/or phosphorous. The isolation insulating layer 50 may be formed by one or more layers of SOG, SiO, SiON, SiOCN and/or fluoride-doped silicate glass (FSG) in some embodiments.

Figure 4:
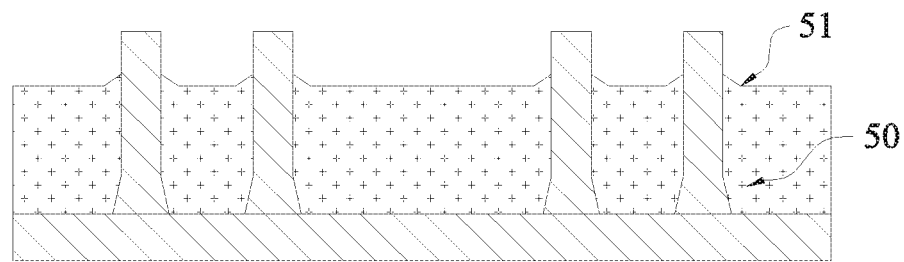

FIG. 4 is an exemplary cross sectional view of the Fin FET device 1 having fin structures 20 at one of the various stages of the fabrication process according to one embodiment.

After forming the isolation insulating layer 50, a planarization operation is performed so as to remove part of the isolation insulating layer 50 and the mask layer 100 (the pad oxide layer 101 and the silicon nitride mask layer 102). Then, the isolation insulating layer 50 is further removed so that an upper part of the fin structure 20, which is to become a channel layer, is exposed, as shown in FIG. 4. The planarization operation may include a chemical mechanical polishing (CMP) and/or an etch-back process.

In at least one embodiment, the silicon nitride layer 102 may be removed using a wet process using hot $H_3PO_4$, while pad oxide layer 101 may be removed using dilute HF acid, if formed of silicon oxide. In some alternative embodiments, the removal of the mask layer 100 may be performed after the recessing of the isolation insulating layer 50.

In certain embodiments, the partially removing the isolation insulating layer 50 may be performed using a wet etching process, for example, by dipping the substrate in hydrofluoric acid (HF). In another embodiment, the partially removing the isolation insulating layer 50 may be performed using a dry etching process, for example, the dry etching process using $CHF_3$ or $BF_3$ as etching gases.

In some embodiments, the surface 51 of the isolation insulating layer 50 may have a shape, in which the isolation regions 50 have raised portions at the sides of the fin structures, and in other embodiments, the surface of the isolation insulating layer 50 may be substantially flat.

After forming the isolation insulating layer 50, a thermal process, for example, an anneal process, may be performed to improve the quality of the isolation insulating layer 50. In certain embodiments, the thermal process is performed by using rapid thermal annealing (RTA) at a temperature in a range of about 900° C. to about 1050° C. for about 1.5 second to about 10 second in inert gas ambient, for example, $N_2$, Ar or He ambient.

Figure 5:
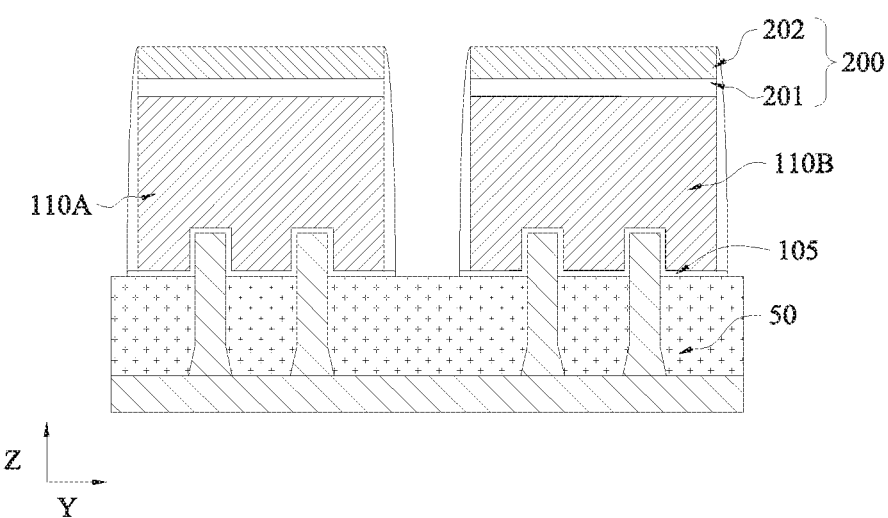
Figure 6A:
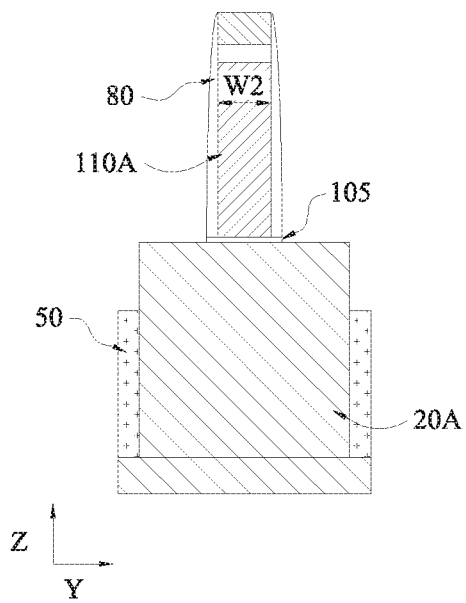
Figure 6B:
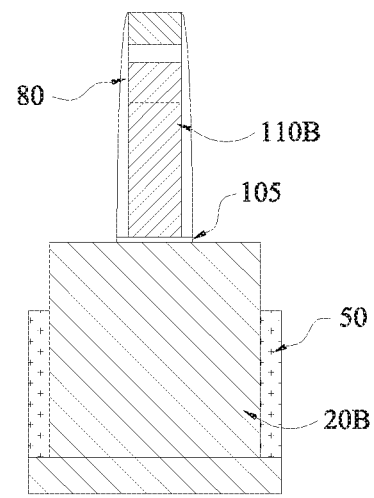

FIG. 5 is an exemplary cross sectional view of the Fin FET device 1 having fin structures 20 at one of the various stages of the fabrication process according to one embodiment. FIGS. 6A and 6B are exemplary cross sectional views along the direction (X direction) in which the fin structures extend.

A gate dielectric layer 105 and a poly silicon layer are formed over the isolation insulating layer 50 and the exposed fin structures 20, and then patterning operations are performed so as to obtain gate stacks including gate electrode layers 110A and 110B made of poly silicon and the gate dielectric layer 105. The patterning of the poly silicon layer is performed by using a hard mask 200 including a silicon nitride layer 201 and an oxide layer 202 in some embodiments. In other embodiments, the layer 201 may be silicon oxide and the layer 202 may be silicon nitride. The gate dielectric layer 105 may be silicon oxide formed by CVD, PVD, ALD, e-beam evaporation, or other suitable process. In some embodiments, the gate dielectric layer 105 may include one or more layers of silicon oxide, silicon nitride, silicon oxy-nitride, or high-k dielectric materials. High-k dielectric materials comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, a thickness of the gate dielectric layer is in the range of about 1 nm to 5 nm. In some embodiments, the gate dielectric layer 105 may include an interfacial layer made of silicon dioxide.

In some embodiments, the gate electrode layers 110A and 110B may comprise a single layer or multilayer structure. In the present embodiment, the gate electrode layers 110A and 110B may comprise poly-silicon. Further, the gate electrode layers 110A and 110B may be doped poly-silicon with uniform or non-uniform doping. In some alternative embodiments, the gate electrode layers 110A and 110B may include a metal such as Al, Cu, W, Ti, Ta, TiN, TiAl, TiAlN, TaN, NiSi, CoSi, other conductive materials with a work function compatible with the substrate material, or combinations thereof. The gate electrode layers 110A and 110B may be formed using a suitable process such as ALD, CVD, PVD, plating, or combinations thereof.

The width W2 of the gate electrode layers 110A and 110B is in the range of about 30 nm to about 60 nm in some embodiments.

Further, side-wall insulating layers 80 are also formed at both sides of the gate electrode layers 110A and 110B. The side-wall insulating layers 80 may include one or more layers of silicon oxide, silicon nitride, silicon oxy-nitride, or other suitable material. The side-wall insulating layers 80 may comprise a single layer or multilayer structure. A blanket layer of a side-wall insulating material may be formed by CVD, PVD, ALD, or other suitable technique. Then, an anisotropic etching is performed on the side-wall insulating material to form a pair of side-wall insulating layers (spacers) 80 on opposing sides of the gate stack. The thickness of the side-wall insulating layers 80 is in a range of about 5 nm to about 15 nm in some embodiments. In certain embodiments, the side-wall insulating layers 80 may not be formed at this stage.

Figure 7A:
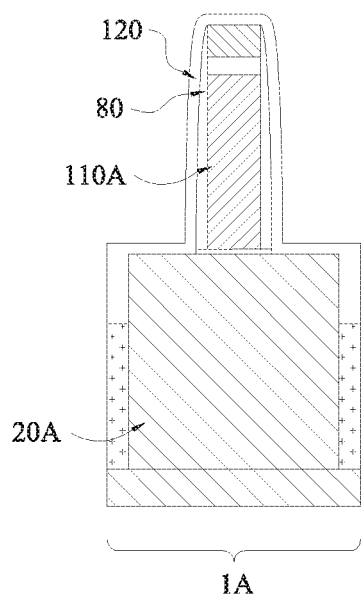
Figure 7B:
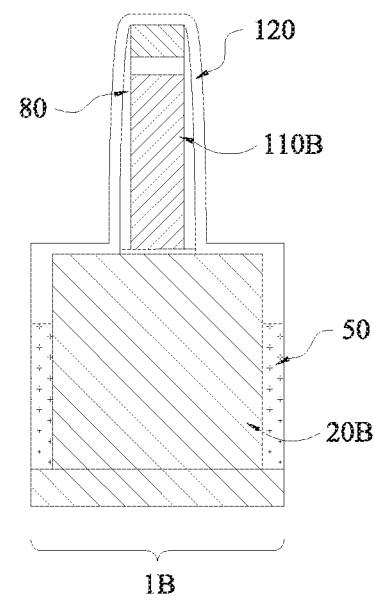
Figure 7C:
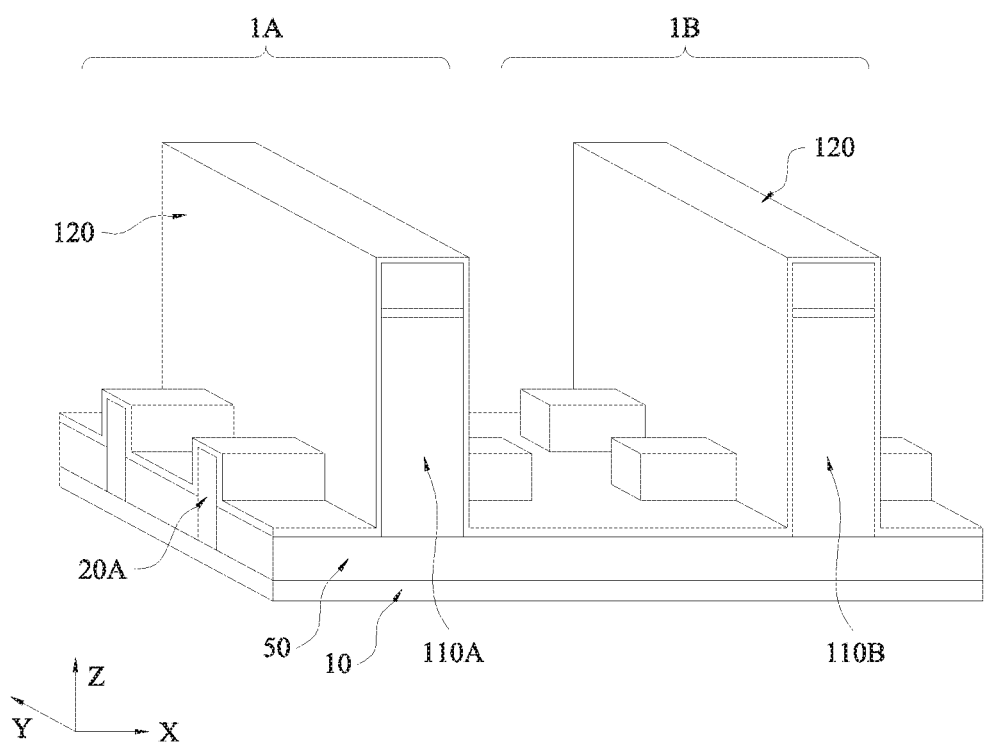

FIGS. 7A and 7B are exemplary cross sectional views and FIG. 7C is an exemplary perspective view of the Fin FET device 1 having gate structures over fin structures at one of the various stages of the fabrication process according to one embodiment.

As shown in FIGS. 7A-7C, a cover layer 120 is formed over the gate structures and the fin structures in the first and second device regions. The cover layer 120 may include silicon nitride with a thickness in a range of about 5 nm to about 15 nm in some embodiments.

Figure 8A:
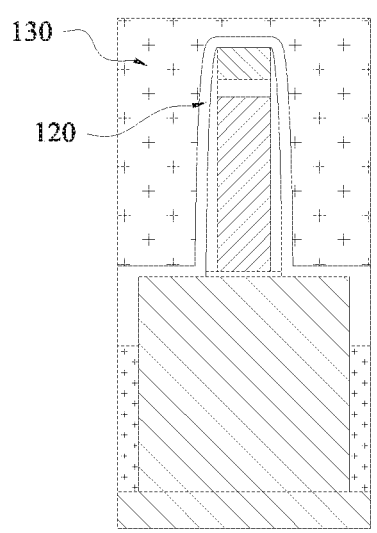
Figure 8B:
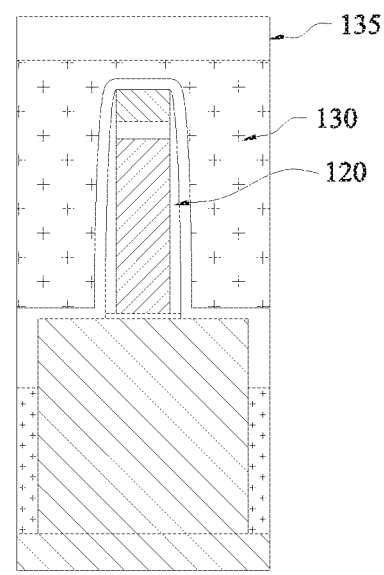
Figure 8C:
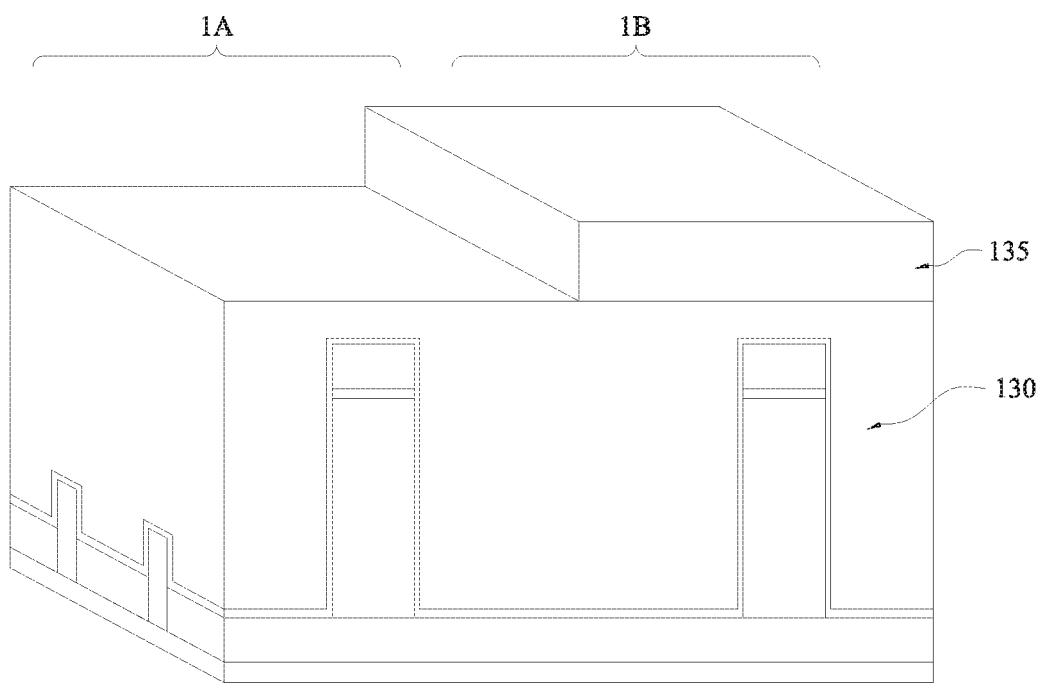

FIGS. 8A and 8B are exemplary cross sectional views and FIG. 8C is an exemplary perspective view of the Fin FET device 1 having gate structures over fin structures at one of the various stages of the fabrication process according to one embodiment.

As shown in FIGS. 8A-8C, a masking layer 130 is formed over the covering layer 120, and further a mask pattern 135 is formed over the masking layer 130 by using a lithographic process. The mask pattern 135 covers the second device region 1B as shown in FIGS. 8B and 8C. The masking layer 130 may include an organic material. In some embodiments, the masking layer includes a material used for a bottom anti-reflection coating (BARC) for a lithographic process. The mask pattern 135 may include a photo resist.

Figure 9A:
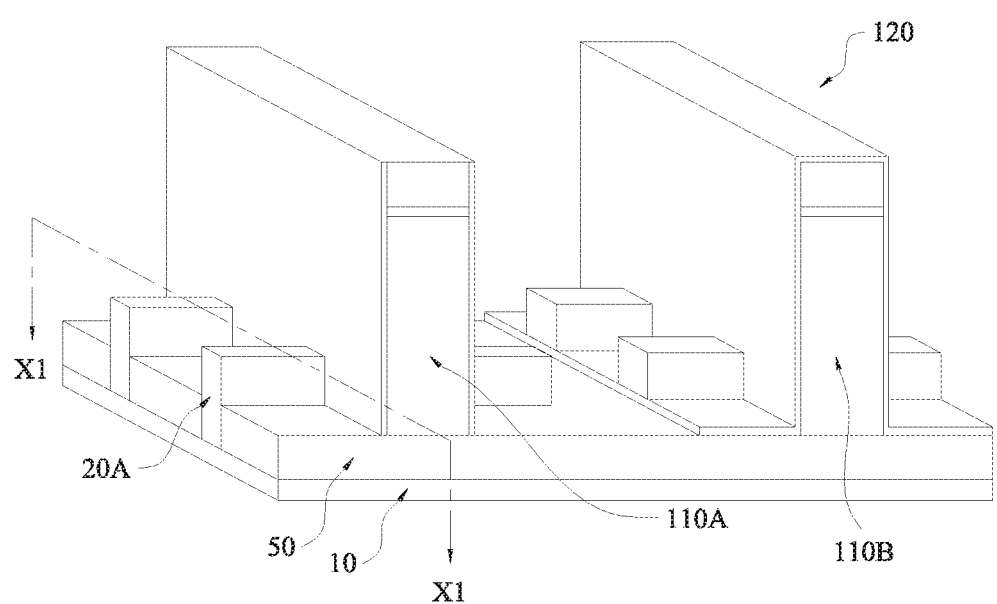
Figure 9B:
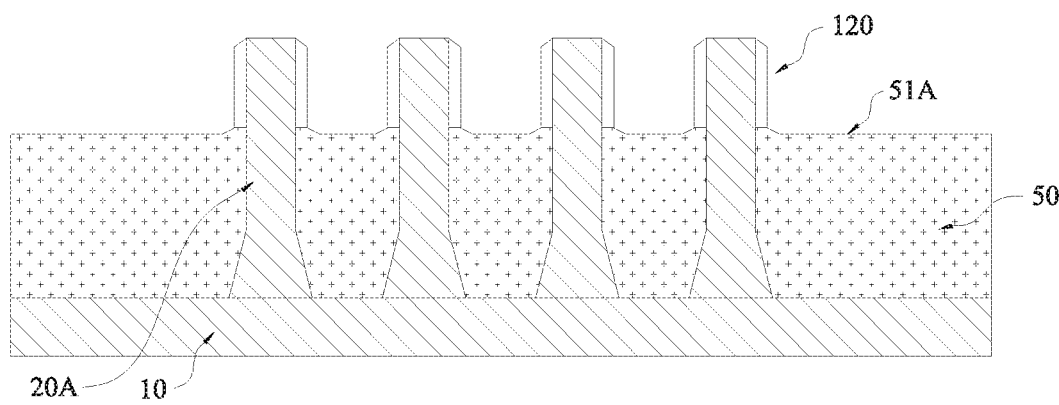

FIG. 9A is an exemplary perspective view and FIG. 9B is an exemplary cross sectional view along X1-X1 in FIG. 9A of the Fin FET device 1 having gate structures over fin structures at one of the various stages of the fabrication process according to one embodiment. In FIG. 9B, four fin structures 20A in the first device region 1A are illustrated for explanatory purposes, while FIG. 9A illustrates two fin structures 20A in the first device region 1A, but the number of the fin structures is not limited to four or two.

By using the mask pattern 135, the masking layer 130 is etched, and by using the etched masking layer, the cover layer (SiN) 120 in the first device region is anisotropically etched. As shown in FIGS. 9A and 9B, the cover layer 120 in the first device region 1A is removed except for side portions of the fin structures 20A and side portions of the gate stack. The upper surfaces of the fin structures 20A are exposed. In some embodiments, part of the side portions of the cover layer 120 is also etched.

In some embodiments, a single layer of photoresist is formed over the second device region 1B, and by using the photo resist layer as a mask, the cover layer 120 is etched. After the cover layer 120 is etched, the masking layer 130 (and the mask pattern 135, if it remains) is removed. In some embodiments, the surface 51A of the isolation insulating layer 50 may have a shape, in which the isolation regions 50 have raised portions at the sides of the fin structures, and in other embodiments, the surface of the isolation insulating layer 50 may be substantially flat.

In some embodiments, the etching of cover layer 120 is performed by using $CH_3F$, $CH_2F_2$, $CF_4$, Ar, HBr, $N_2$, He and/or $O_2$ as etching gas under a pressure of 3~50 mTorr at a temperature of 20 to 70° C.

Figure 10A:
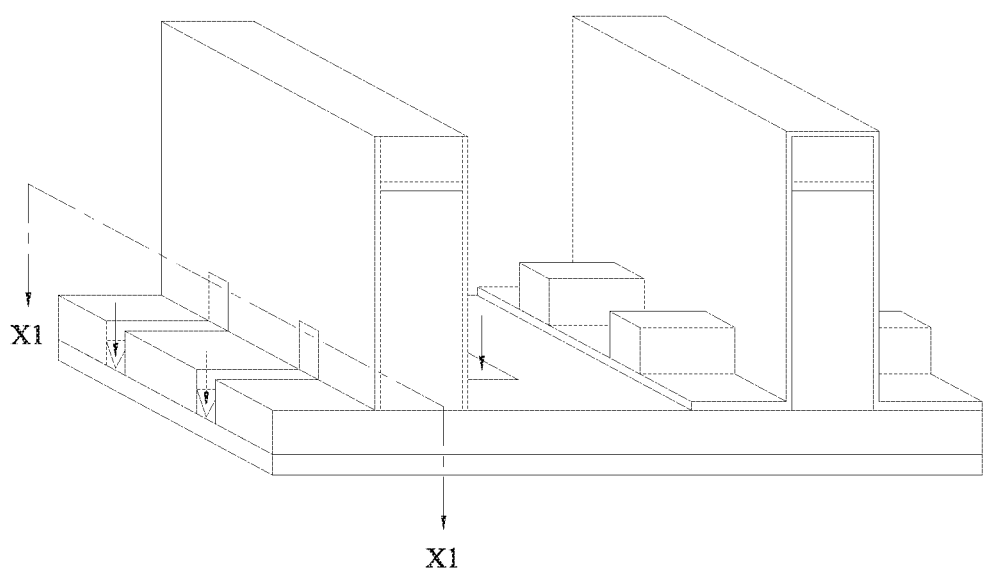
Figure 10B:
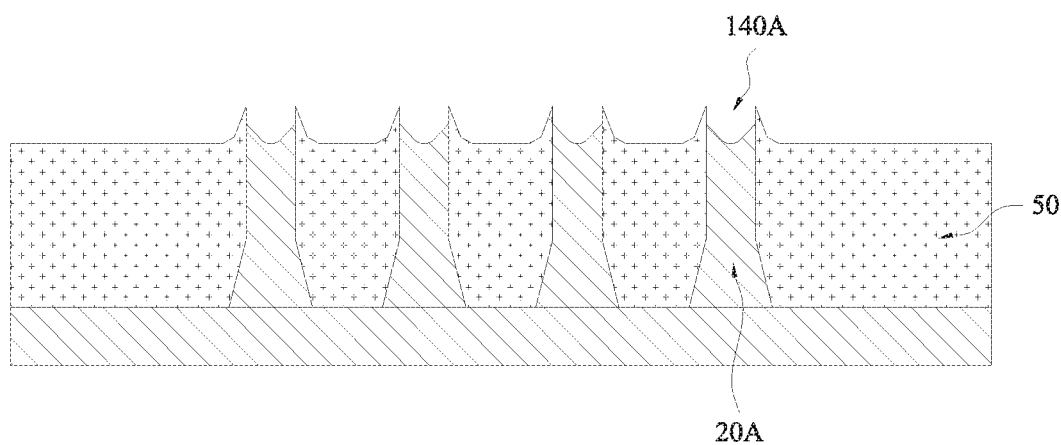
Figure 10C:
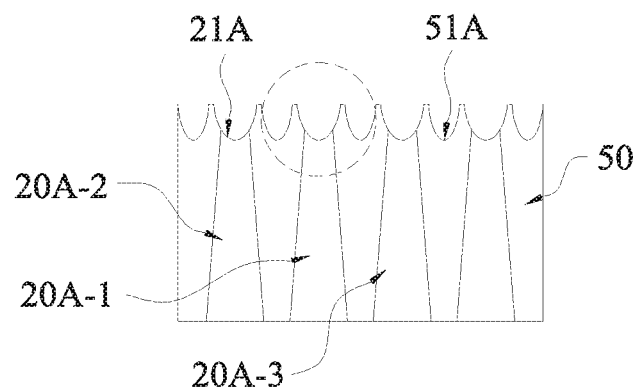
Figure 10D:
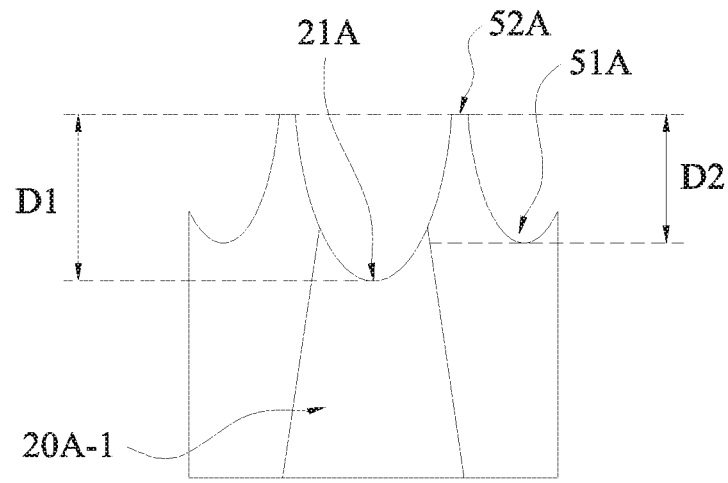
Figure 10E:
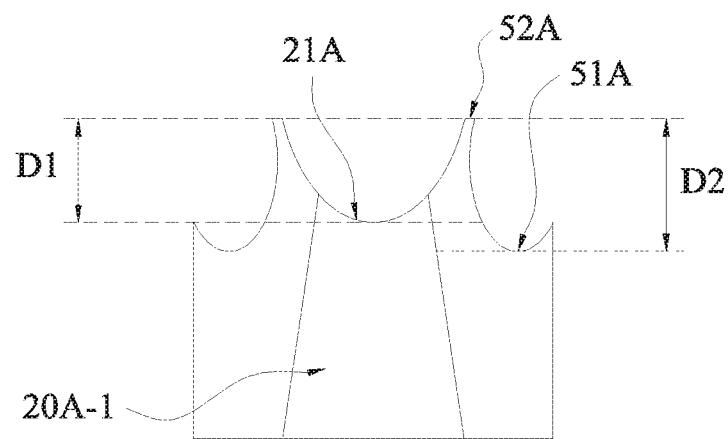

FIG. 10A is an exemplary perspective view, FIG. 10B is an exemplary cross sectional view along X1-X1 of FIG. 10A, and FIGS. 10C-10E are exemplary cross sectional views of the Fin FET device 1 having fin structures at one of the various stages of the fabrication process according to one embodiment. FIGS. 10D and 10E are enlarged views of the circled portion of FIG. 10C.

The portions of the fin structure 20A not covered by the gate structure are recessed to form a recessed portion 140A of the fin structure 20A. The recessed portion 140A is formed such that a top surface of the fin structure 20A is located below the top surface of the isolation insulating layer 50.

In certain embodiments, a biased etching process is performed to recess the top surface of the fin structure 20A that are unprotected or exposed to form the recessed portion 140A. During the recess etching, or subsequently, the cover layers 120 located adjacent to the fin structures are removed.

As shown in FIGS. 10B-10E, part of the upper surface 51A of the isolation insulating layer 50 between the fin structures is also recessed, and both the upper surface 51A of the isolation insulating layer 50 and the upper surfaces 21A of the recessed fin structures 20A have a concave shape (a smiling shape). For example, a smiling shape can be found at the region of the isolation insulation layer 50 between the center fin structure 20A-11 and the left fin structure 20A-2 and/or at the region of the isolation insulation layer 50 between the center fin structure 20A-1 and the right fin structure 20A-3.

In FIG. 10D, a depth D1 of the upper surface 21A of the recessed fin structure 20A (20A-1) measured from the upper-most surface 52A of the isolation insulating layer 50 around the fin structures is greater than a depth D2 of the upper surface 51A of the recessed portion of the isolation insulating layer 50 between the fin structures measured from the upper-most surface 52A of the isolation insulating layer 50, i.e., D1>D2. D1 is in a range of about 0 nm to about 100 nm, and D2 is also in a range about 0 nm to about 100 nm in some embodiments.

In FIG. 10E, the depth D1 of the upper surface 21A of the recessed fin structure 20A (20A-1) measured from the upper-most surface 52A of the isolation insulating layer 50 around the fin structures is smaller than the depth D2 of the upper surface 51A of the recessed portion of the isolation insulating layer 50 between the fin structures measured from the upper-most surface 52A of the isolation insulating layer 50, i.e., 0≤D1≤D2 (but D1 and D2 are not zero at the same time). In some embodiments, 0<D1<D2. D1 is in a range of about 0 nm to about 100 nm, and D2 is also in a range about 0 nm to about 100 nm in some embodiments. The difference ΔD between D1 and D2 is in a range of about 10 nm to 70 nm, in some embodiments, and in a range of about 20 nm to 50 nm in other embodiments. The depth D2 may be measured at either the region of the isolation insulation layer 50 between the center fin structure 20A-1 and the left fin structure 20A-2 and/or at the region of the isolation insulation layer 50 between the center fin structure 20A-1 and the right fin structure 20A-3.

In some embodiments, the recess etching is performed by using Ar, HBr, $N_2$ and/or He as etching gas under a pressure of 3~50 mTorr at a temperature of 20 to 70° C.

Figure 11A:
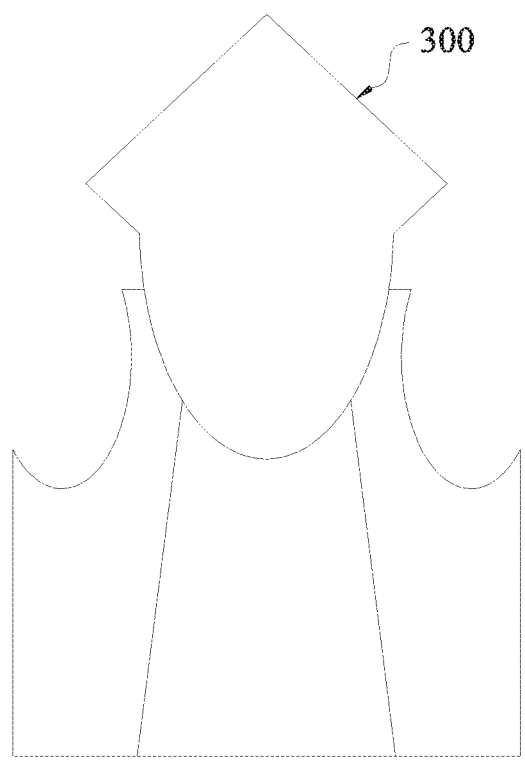
Figure 11B:
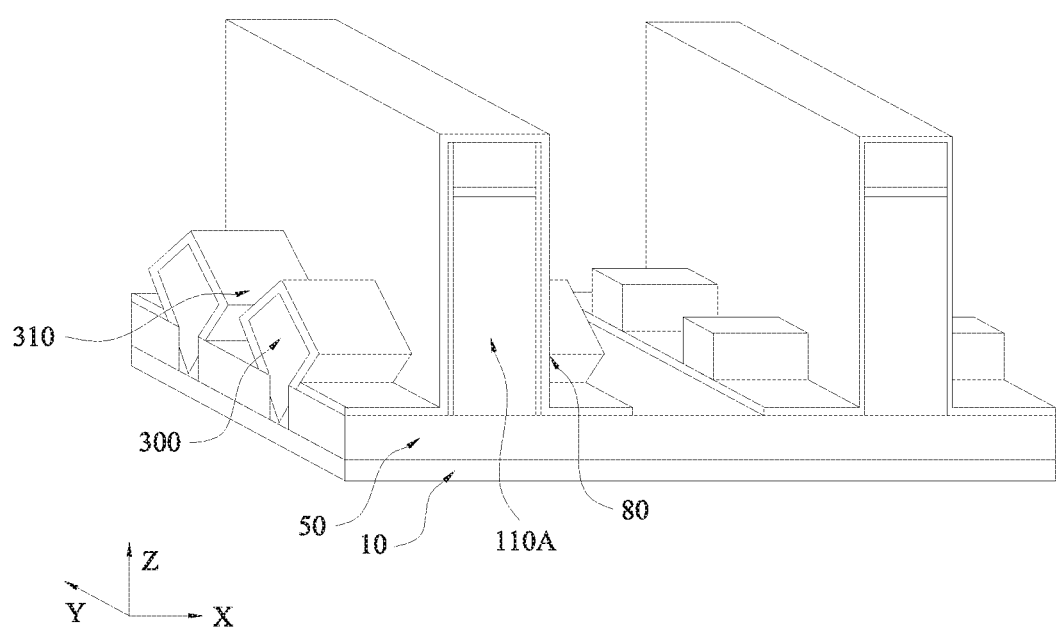

FIG. 11A is an exemplary cross sectional view and FIG. 11B is an exemplary perspective view of the Fin FET device 1 having gate structures over fin structures at one of the various stages of the fabrication process according to one embodiment.

In the recessed portion 140A, a first stressor layer 300 is formed. The first stressor layer 300 may be formed by selectively growing a strained material over the recessed portion 140A and above the isolation insulating layer 50. Since the lattice constant of the strained material is different from the fin structure 20 and the substrate 10, the channel region of the fin structure 20 is strained or stressed to increase carrier mobility of the device and enhance the device performance.

In one embodiment of the present disclosure, the first stressor layer 300 is SiC, SiP and/or SiCP for an n-type Fin FET. As shown in FIG. 10E, when the depth D1 and the depth D2 satisfy D1≤D2, a volume of epitaxially grown stressor layer 300 becomes greater than the case where D1>D2. Further, when D1≤D2 is satisfied, a position of the stressor layer 300 can be more accurately controlled, and a gate resistance and/or a source/drain resistance can be reduced.

In at least one embodiment, SiC as the stressor layer 300 can be epitaxially-grown by an LPCVD process to form the source and drain regions of the n-type FinFET. The LPCVD process is performed at a temperature of about 400 to 800° C. and under a pressure of about 1 to 200 Torr, using $Si_3H_8$ and $SiH_3CH$ as reaction gases, in some embodiments.

In the present embodiment, the selective growth of the first stressor layer 300 continues until the material 300 extends vertically a distance ranging from about 10 to 100 nm from the bottom of the recessed portion 140A and extends laterally over the top surfaces of the isolation insulating layer 50. The formed first stressor layer 300 corresponds to source/drain of the n-type Fin FET. The first stressor layer 300 may be a single layer or may include multiple stressor layers.

Further, in some embodiments, a cap layer 310 may be additionally formed over the stressor layer 300. The cap layer 310 enhances an application of the stress by the stressor layer 300 to the channel layer. In other embodiments, a protective layer made of, for example, silicon nitride, may be formed over the stressor layer.

After the Fin FETs in the first device region 1A (e.g., n-type Fin FETs) are formed, the Fin FETs in the second device region 1B are processed in a similar matter to the first device region.

Figure 12A:
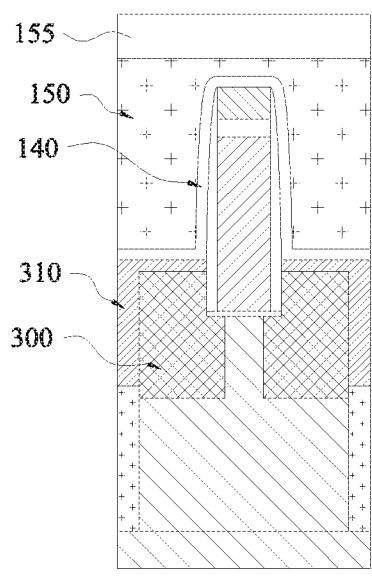
Figure 12B:
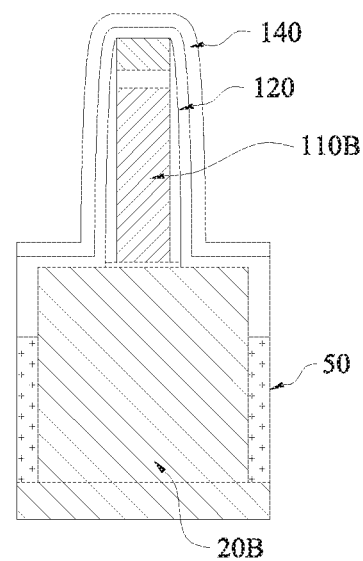
Figure 12C:
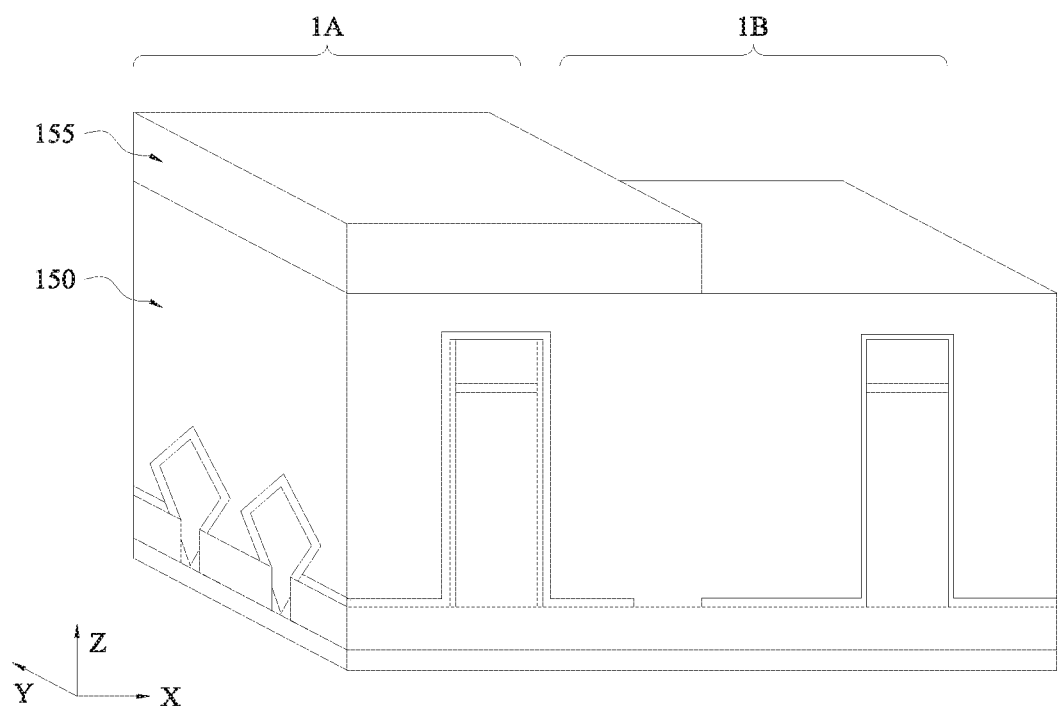

FIGS. 12A and 12B are exemplary cross sectional views and FIG. 12C is an exemplary perspective view of the Fin FET device 1 having fin structures 20 at one of the various stages of the fabrication process according to one embodiment.

Similar to FIGS. 7A and 7B, a cover layer 140 is formed over the gate structures and the fin structures in the first and second device regions. The cover layer 140 may include silicon nitride with a thickness in a range of about 5 nm to about 15 nm in some embodiments.

Similar to FIGS. 8A-8C, a masking layer 150 is formed over the covering layer 140, and further a mask pattern 155 is formed over the masking layer 150 by using a lithographic process. The mask pattern 155 covers the first device region 1A as shown in FIGS. 12A and 12C. The masking layer 150 may include an organic material. In some embodiments, the masking layer 150 includes a material used for a bottom anti-reflection coating (BARC) for a lithographic process. The mask pattern 155 may include a photo resist.

Similar to FIGS. 9A and 9B, by using the mask pattern 155, the masking layer 150 is etched, and by using the etched masking layer 150, the cover layers 120 and 140 in the second device region are anisotropically etched. Similar to FIGS. 9A and 9B, the cover layers in the second device region 1B are removed except for side portions of the fin structures 20B and side portions of the gate stack. The upper surfaces of the fin structures 20B are exposed. The cover layers (SiN) 120 and 140 in the second device region 1B are removed, while the cover layer 140 still covers the first device region 1A to protect the first device region from the subsequent operation for the second device region. In some embodiments, a single layer of photo resist is formed over the first device region 1A, and by using the photo resist layer, the cover layers 120 and 140 in the second device region are etched. After the cover layer 120 and 140 are etched, the masking layer 150 (and the mask pattern 155, if it remains) is removed. It is noted that similar to FIG. 4, the surface 51B of the isolation regions 50B has a smiling profile.

Figure 13A:
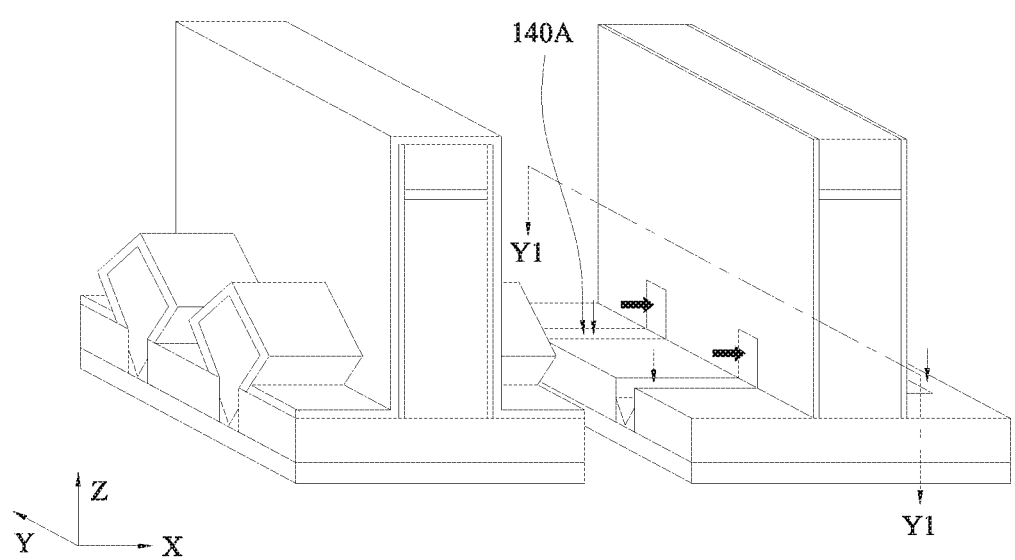
Figure 13B:
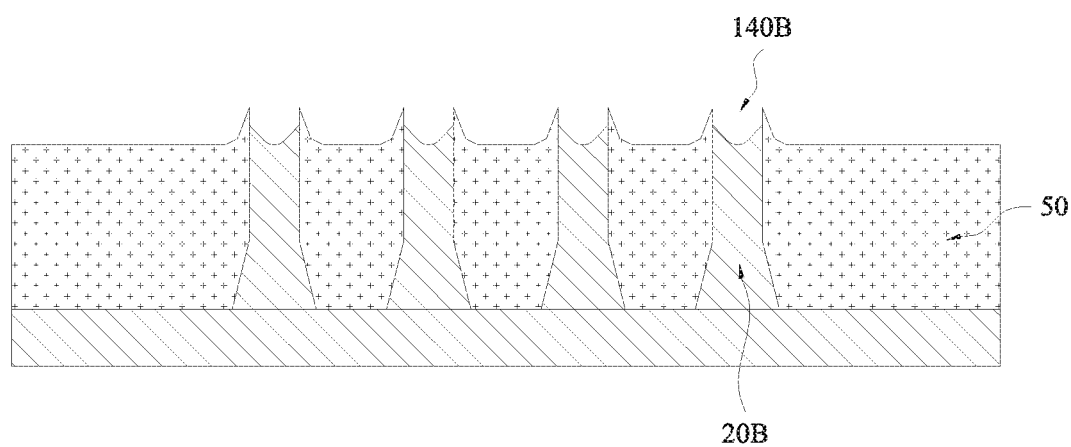
Figure 13C:
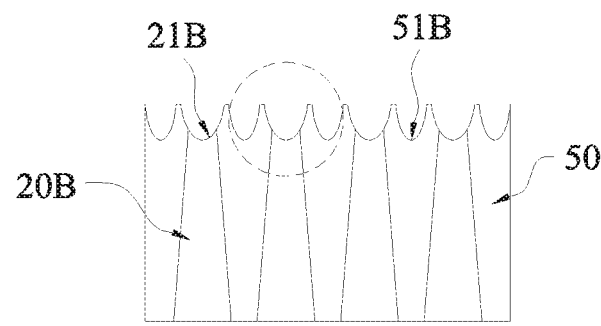
Figure 13D:
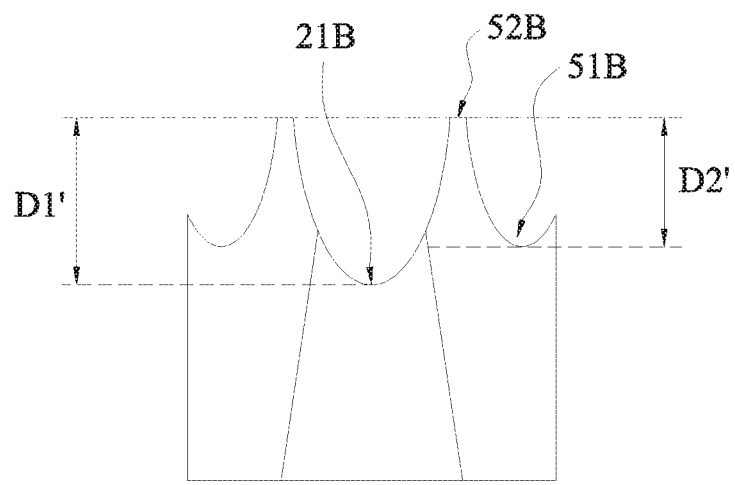
Figure 13E:
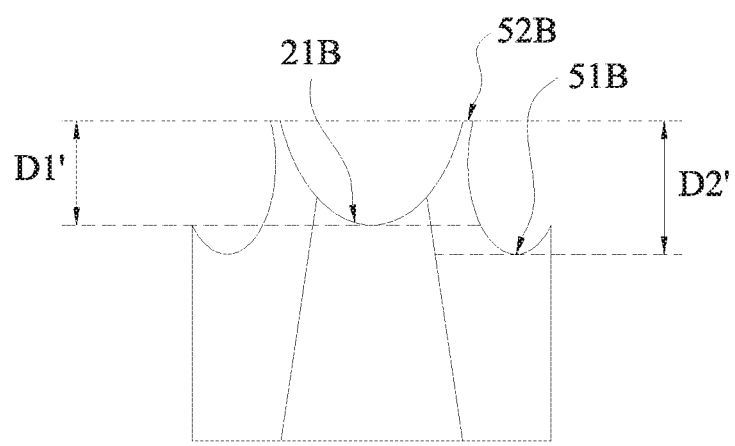

FIG. 13A is an exemplary perspective view, FIG. 13B is an exemplary cross sectional view along Y1-Y1 of FIG. 13A, and FIGS. 13C-13E are exemplary cross sectional views of the Fin FET device 1 having fin structures at one of the various stages of the fabrication process according to one embodiment. FIGS. 13D and 13E are enlarged views of the circled portion of FIG. 10C. In FIG. 13B, four fin structures 20B in the second device region 1B are illustrated, while FIG. 13A illustrates two fin structures 20B in the second device region 1B, but the number of the fin structures is not limited to four or two.

The portions of the fin structure 20B not covered by the gate structure are recessed to form a recessed portion 140B of the fin structure 20B. The recessed portion 140B is formed such that a top surface of the fin structure 20B is located below the top surface of the isolation insulating layer 50.

In certain embodiments, using the cover layers 120 and 140 remaining on the side walls of the fin structure 20B as hard masks, a biased etching process is performed to recess the top surface of the fin structure 20B that are unprotected or exposed to form the recessed portion 140B. Subsequently, the cover layers 120 and 140 located adjacent to the fin structures are removed.

As shown in FIGS. 13B-13E, the upper surface 51B of the isolation insulating layer 50 between the fin structures is also recessed, and both the upper surface 51B of the isolation insulating layer 50 and the upper surfaces 21B of the recessed fin structures 20B have a concave shape (a smiling shape).

In FIG. 13D, a depth D1' of the upper surface 21B of the recessed fin structure 20B measured from the upper-most surface 52B of the isolation insulating layer 50 around the fin structures is greater than a depth D2' of the upper surface 51B of the recessed portion of the isolation insulating layer 50 between the fin structures measured from the upper-most surface 52B of the isolation insulating layer 50, i.e., D1'>D2'. D1' is in a range of about 0 nm to about 100 nm, and D2' is also in a range about 0 nm to about 100 nm in some embodiments.

In FIG. 13E, the depth D1' of the upper surface 21B of the recessed fin structure measured from the upper-most surface 52B of the isolation insulating layer 50 around the fin structures is smaller than the depth D2' of the upper surface 51B of the recessed portion of the isolation insulating layer 50 between the fin structures measured from the upper-most surface 52B of the isolation insulating layer 50, i.e., 0≤D1'≤D2' (but D1' and D2' are not zero at the same time). In some embodiments, 0<D1'<D2'. D1' is in a range of about 0 nm to about 100 nm, and D2' is also in a range about 0 nm to about 100 nm in some embodiments. The difference ΔD' between D1' and D2' is in a range of about 10 nm to 70 nm, in some embodiments, and in a range of about 20 nm to 50 nm in other embodiments.

Figure 14A:
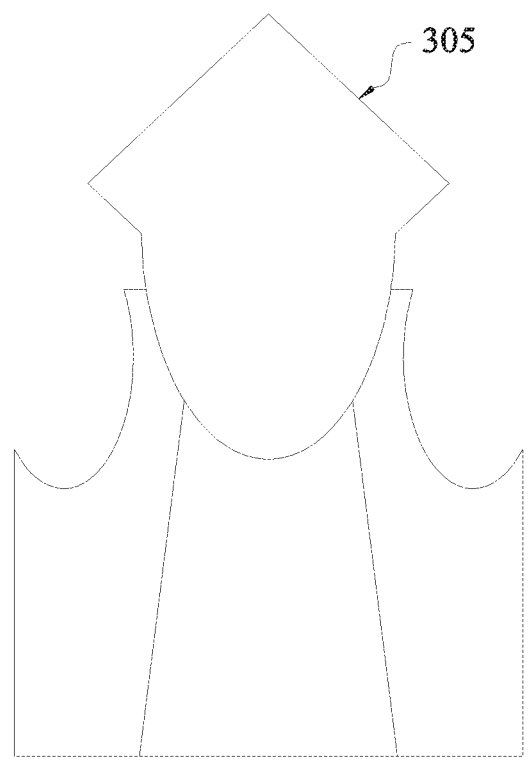
Figure 14B:
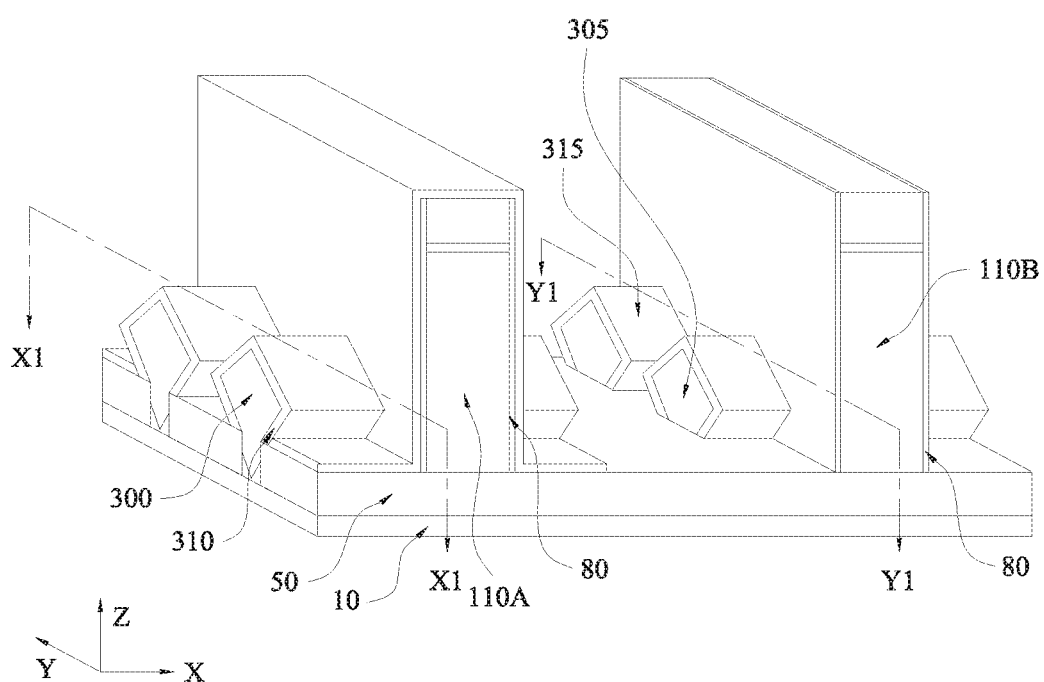

FIG. 14A is an exemplary cross sectional view and FIG. 14B is an exemplary perspective view of the Fin FET device 1 having gate structures over fin structures at one of the various stages of the fabrication process according to one embodiment.

In the recessed portion 140B, a second stressor layer 305 is formed. The second stressor layer 305 may be formed by selectively growing a strained material over the recessed portion 140B and above the isolation insulating layer 50. Since the lattice constant of the strained material is different from the fin structure 20B and the substrate 10, the channel region of the fin structure 20B is strained or stressed to increase carrier mobility of the device and enhance the device performance.

In one embodiment of the present disclosure, the second stressor layer 305 is SiGe for a p-type Fin FET. As shown in FIG. 13E, when the depth D1' and the depth D2' satisfy D1'≤D2', a volume of epitaxially grown stressor layer 305 becomes greater than the case where D1'>D2'. Further, when D1'≤D2' is satisfied, a position of the second stressor layer 305 can be more accurately controlled, and a gate resistance and/or a source/drain resistance can be reduced.

In at least one embodiment, SiGe as the second stressor layer 305 can be epitaxially-grown by an LPCVD process to form the source and drain regions of the p-type FinFET. The LPCVD process is performed at a temperature of about 400 to 800° C. and under a pressure of about 1 to 200 Torr, using $SiH_4$ and $GeH_4$ as reaction gases, in some embodiments.

In the present embodiment, the selective growth of the second stressor layer 305 continues until the material 305 extends vertically a distance ranging from about 10 to 100 nm from the bottom of the recessed portion 140B and extends laterally over the top surfaces of the isolation insulating layer 50. The formed second stressor layer 305 corresponds to the source/drain of the p-type Fin FET. The second stressor layer 305 may be a single layer or may include multiple stressor layers.

Further, in some embodiments, a cap layer 315 is formed over the stressor layer 305. When the stressor layer 305 is SiGe, the cap layer 315 is Si epitaxially-grown by an LPCVD process. The cap layer 315 enhances application of the stress by the stressor layer 305 to the channel layer.

Figure 15A:
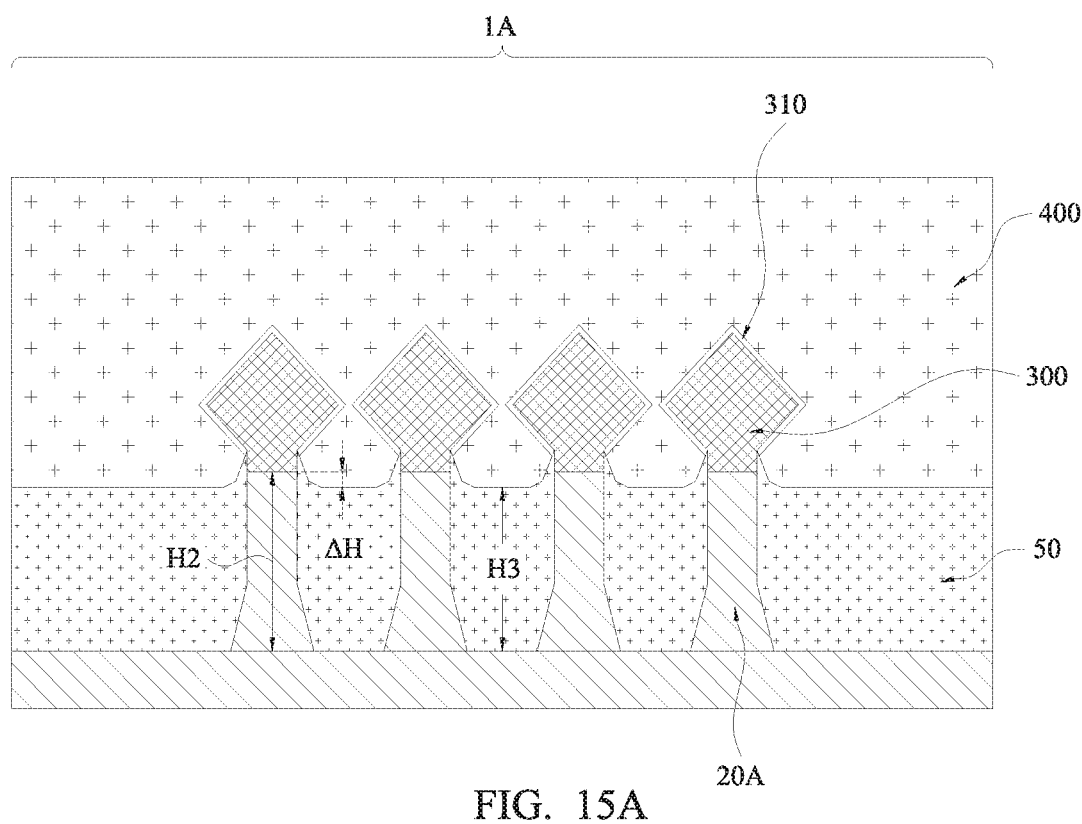
Figure 15B:
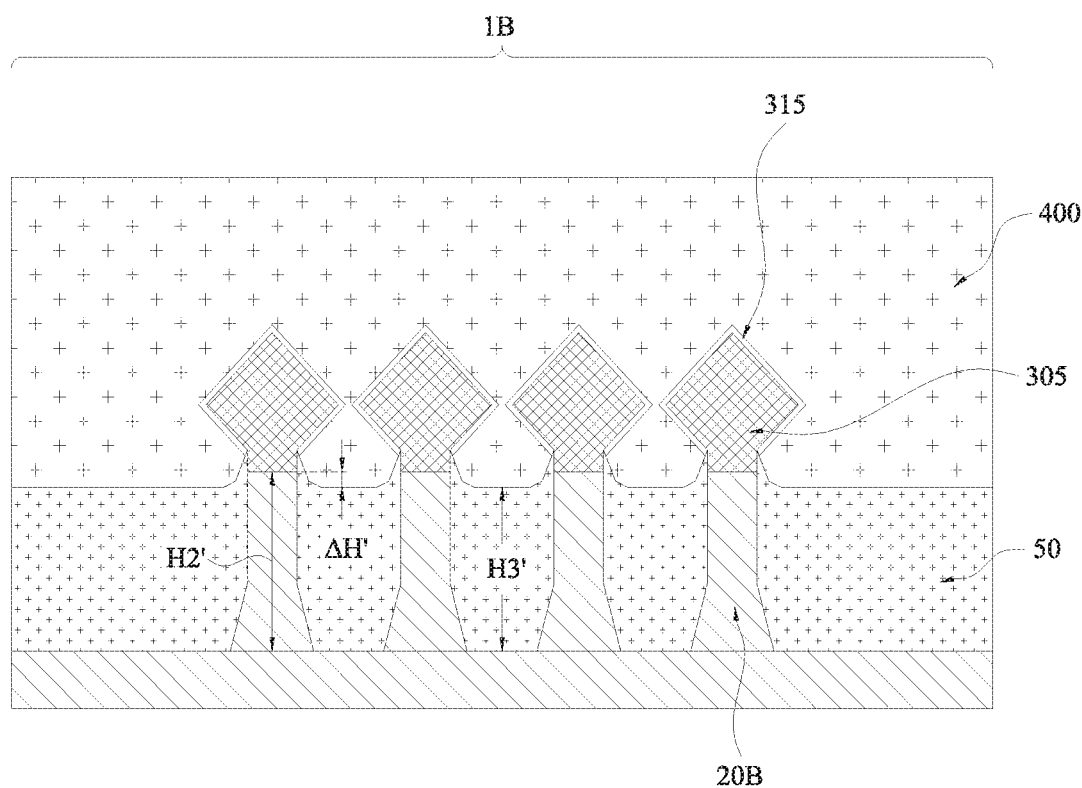

FIGS. 15A and 15B are exemplary cross sectional views of the Fin FET device 1 having fin structures 20 at one of the various stages of the fabrication process according to one embodiment. FIG. 15A is an exemplary cross sectional view along X1-X1 of FIG. 14B and FIG. 15B is an exemplary cross sectional view along Y1-Y1 of FIG. 14B. In FIGS. 15A and 15B, four fin structures 20A and 20B are illustrated for an explanation purpose, while FIG. 14B illustrates two fin structures 20A and 20B in the first and second device regions, respectively, but the number of the fin structures is not limited to four or two.

As shown in FIG. 15A, an interlayer dielectric layer 400 is formed over the gate structures and the sources/drains in the first device region 1A. The dielectric layer 400 is also formed over the gate structures and the sources/drains in the second device region 1B, as shown in FIG. 15B.

As shown in FIG. 15A, a height H2 of the interface between the fin structure 20A and the first stressor layer 300 is greater than a height H3 of the isolation insulating layer 50 (the lowest height between the fins structures), measured from the substrate. The difference ΔH between H2 and H3 is in a range of about 10 nm to 70 nm, in some embodiments, and in a range of about 20 nm to 50 nm in other embodiments.

Similarly, as shown in FIG. 15B, a height H2' of the interface between the fin structure 20B and the second stressor layer 305 is greater than a height H3' of the isolation insulating layer 50 (the lowest height outside the fin structure area, or the lowest height between the fins structures), measured from the substrate. The difference ΔH' between H2' and H3' is in a range of about 10 nm to 70 nm, in some embodiments, and in a range of about 20 nm to 50 nm in other embodiments.

Although the first and second stressor layers 300 and 305 and the cap layers 310 and 315 are separately formed in FIGS. 15A and 15B, the adjacent cap layers 310 and/or 315 may be connected in certain embodiments.

It is understood that the Fin FETs in the first and second device regions may undergo further CMOS processes to form various features such as contacts/vias, interconnect metal layers, dielectric layers, passivation layers, etc. The modified insulation and strained structure provides a given amount of strain into channel region of a FinFET, thereby enhancing the device performance.

Figure 16:
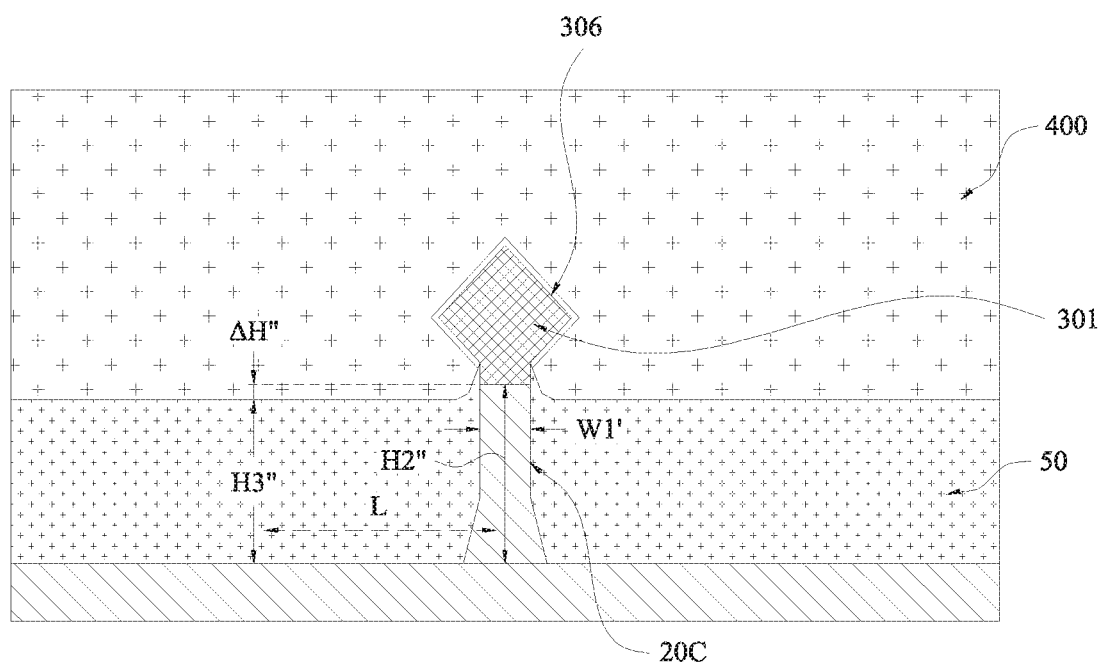

FIG. 16 shows an exemplary cross section view of a Fin FET device 2 having a fin structure 20C (see, FIG. 1C) at one of the various stages of the fabrication process according to another embodiment of the present disclosure.

In the Fin FET device 1, plural fin structures are disposed with a predetermined interval. On the other hand, in the Fin FET device 2, one structure is disposed over the substrate as an isolated Fin FET. It is noted that the term "isolated" means that a distance to another Fin FET is more than 5×W1' (W1' is a width of the upper part of the fin structure just below the surface of the isolation insulating layer).

As shown in FIG. 16, the Fin FET device 2 includes a fin structure 20C, a stressor layer 301, a cap layer 306, an isolation insulating layer 50 and an interlayer dielectric layer 400. Fin FET device 2 may be an n-type Fin FET or a p-type Fin FET. When the fin FET device 2 is an n-type Fin FET, the stressor layer 301 may be SiC, SiP and/or SiCP. When the fin FET device 2 is a p-type Fin FET, the stressor layer 301 may be SiGe. The stressor layer 301 may be a single layer or may include multiple stressor layers.

As shown in FIG. 16, a height H2" of the interface between the fin structure 20C and the stressor layer 301 is greater than a height H3" of the isolation insulating layer 50, measured from the substrate. The height H3" is measured at a position of a distance L from the center of the fin structure 20C. The distance L is in a range about 2.5×W1 to about 5×W1. The difference ΔH" between H2" and H3" is in a range of about 10 nm to 70 nm, in some embodiments, and in a range of about 20 nm to 50 nm in other embodiments.

Similar to the fabrication processes of the Fin FET device 1 shown in FIGS. 10E and/or 13E, in forming a recess of the fin structure 20C, a depth of the upper surface of the recessed fin structure 20C is set smaller than a depth of the upper surface of the recessed portion of the isolation insulating layer. Accordingly, a volume of epitaxially grown stressor layer 301 can be greater, a position of the stressor layer 301 can be more accurately controlled, and a gate resistance and/or a source/drain resistance can be reduced.

It is understood that the Fin FET device 2 may undergo further CMOS processes to form various features such as contacts/vias, interconnect metal layers, dielectric layers, passivation layers, etc. The modified insulation and strained structure provides a given amount of strain into channel region of a Fin FET, thereby enhancing the device performance.

The various embodiments or examples described herein offer several advantages over the existing art. In the present disclosure, a depth (height) of the isolation insulating layer (STI oxide) and a depth (height) of the fin recess in the source/drain regions are controlled, thereby controlling dimensions of an epitaxial layer formed in the fin recess in the FinFET process. For example, a depth of the upper surface of the recessed fin structure measured from the upper-most surface of the isolation insulating layer around the fin structures is set smaller than a depth of the upper surface of the recessed portion of the isolation insulating layer between the fin structures measured from the upper-most surface of the isolation insulating layer. By doing so, a volume of epitaxially grown stressor layer can be greater, a position of the stressor layer can be more accurately controlled, and a gate resistance and/or a source/drain resistance can be reduced. Accordingly, it is possible to improve device performance (e.g., gain, speed and stability).

It will be understood that not all advantages have been necessarily discussed herein, no particular advantage is required for all embodiments or examples, and other embodiments or examples may offer different advantages.

In accordance with one aspect of the present disclosure, a method for manufacturing a semiconductor device includes forming a fin structure over a substrate. An isolation insulating layer is formed so that an upper part of the fin structure protrudes from the isolation insulating layer. A gate structure is formed over a part of the fin structure and over the isolation insulating layer. Recesses are formed in the isolation insulating layer at both sides of the fin structure. A recess is formed in a portion of the fin structure which is not covered by the gate structure. The recess in the fin structure and the recesses in the isolation insulating layer are formed such that a depth D1 of the recess in the fin structure and a depth D2 of the recesses in the isolation insulating layer measured from an uppermost surface of the isolation insulating layer satisfy $0 \leq D1 \leq D2$ (but D1 and D2 are not zero at the same time).

In accordance with another aspect of the present disclosure, a method for manufacturing a semiconductor device includes forming fin structures over a substrate. The fin structures include a center fin structure, a left fin structure and a right fin structure. An isolation insulating layer is formed so that upper parts of the fin structures protrude from the isolation insulating layer. A gate structure is formed over a part of the fin structures and over the isolation insulating layer. Recesses are formed in the isolation insulating layer at least at a portion between the left fin structure and the center fin structure and a portion between the right fin structure and the center fin structure. Recesses are formed in portions of the left, center and right fin structures, which are not covered by the gate structure. The recesses in the left, center and right fin structures and the recesses in the isolation insulating layer are formed such that a depth D1 of the recess in the center fin structure and a depth D2 of at least one of the recesses in the isolation insulating layer formed between the left fin structure and the center fin structure and between the right fin structure and the center fin structure satisfy 0≤D1≤D2 (but D1 and D2 are not zero at the same time), where D1 and D2 are measured from an uppermost surface of the isolation insulating layer located between the left fin structure and the center fin structure or between the right fin structure and the center fin structure.

In accordance with another aspect of the present disclosure, a semiconductor device includes a Fin FET device. The Fin FET device includes a first fin structure extending in a first direction and protruding from an isolation insulating layer, the first fin structure and the isolation insulating layer being disposed over a substrate. The Fin FET device also includes a first gate stack including a first gate electrode layer and a first gate dielectric layer, covering a portion of the first fin structure and extending in a second direction perpendicular to the first direction. The Fin FET device further includes a first source and a first drain, each including a first stressor layer disposed over the first fin structure. The first stressor layer applies a stress to a channel layer of the first fin structure under the first gate stack. A height Ha of an interface between the first fin structure and the first stressor layer measured from the substrate is greater than a height Hb of a lowest height of the isolation insulating layer measured from the substrate.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a Fin FET device including:
a first fin structure disposed over a substrate and extending in a first direction;
an isolation insulating layer disposed over the substrate;
a gate electrode disposed over the first fin structure and extending in a second direction crossing the first direction; and
a first source/drain stressor layer made of semiconductor material and disposed over the first fin structure, wherein:
the first source/drain stressor layer is in contact with the isolation insulating layer and the first fin structure, and
in a cross section along the second direction, a bottom of the first source/drain stressor layer in contact with the isolation insulating layer and the first fin structure has a rounded convex shape toward the first fin structure.

2. The semiconductor device of claim 1, wherein:
the Fin FET device further includes:
a second fin structure disposed adjacent to the first fin structure; and
a second source/drain stressor layer disposed over the second fin structure, and
a surface of the isolation insulating layer between the first fin structure and the second fin structure has a rounded convex shape toward the substrate.

3. The semiconductor device of claim 2, wherein a bottom of the rounded convex shape of the first source/drain stressor layer is located above a bottom of the rounded convex shape of the isolation insulating layer.

4. The semiconductor device of claim 2, wherein a bottom of the rounded convex shape of the first source/drain stressor layer is located below a bottom of the rounded convex shape of the isolation insulating layer.

5. The semiconductor device of claim 2, wherein a bottom of the rounded convex shape of the first source/drain stressor layer is located at a same level as a bottom of the rounded convex shape of the isolation insulating layer.

6. The semiconductor device of claim 1, wherein the first source/drain stressor layer includes at least one of SiP, SiC and SiCP.

7. The semiconductor device of claim 1, wherein the first source/drain stressor layer includes SiGe.

8. A semiconductor device, comprising:
a Fin FET device including:
a first fin structure disposed over a substrate and extending in a first direction;
an isolation insulating layer disposed over the substrate;
a gate electrode disposed over the first fin structure and extending in a second direction crossing the first direction;
a first source/drain stressor layer made of semiconductor material and disposed over the first fin structure; and
an interlayer dielectric layer, wherein:
the first source/drain stressor layer is in contact with the isolation insulating layer and the first fin structure, and
in a cross section along the second direction, a bottom of the first source/drain stressor layer in contact with the first fin structure has a rounded convex shape toward the first fin structure.

9. The semiconductor device of claim 8, wherein:
the Fin FET device further includes:
a second fin structure disposed adjacent to the first fin structure; and
a second source/drain stressor layer disposed over the second fin structure, and
a surface of the isolation insulating layer between the first fin structure and the second fin structure has a rounded convex shape toward the substrate.

10. The semiconductor device of claim 9, wherein a lowest portion of the bottom of the first source/drain stressor layer is located between a lowest portion of the rounded convex shape of the isolation insulating layer and an highest portion of the isolation insulating layer.

11. The semiconductor device of claim 9, wherein a lowest portion of the rounded convex shape of the isolation insulating layer is located between a lowest portion of the bottom of the first source/drain stressor layer and an highest portion of the isolation insulating layer.

12. The semiconductor device of claim 9, wherein a different between a lowest portion of the rounded convex shape of the isolation insulating layer and a lowest portion of the bottom of the first source/drain stressor is in a range from 10 nm to 70 nm.

13. The semiconductor device of claim 8, wherein the first source/drain stressor layer includes at least one of SiP, SiC and SiCP.

14. The semiconductor device of claim 8, wherein the first source/drain stressor layer includes SiGe.

15. A semiconductor device, comprising:
an isolation insulating layer disposed over a substrate;
a first fin structure disposed over the substrate and extending in a first direction;
a second fin structure disposed over the substrate;
a gate electrode disposed over the first fin structure and extending in a second direction crossing the first direction:
a first source/drain stressor layer disposed over the first fin structure and made of a different material than the first fin structure; and
a second source/drain stressor layer disposed over the second fin structure and made of a same material as the first stressor layer, wherein:
in a cross section along the second direction, a bottom of the first source/drain stressor layer in contact with the first fin structure has a rounded convex shape toward the first fin structure, and
in a cross section along the second direction, a bottom of the second source/drain stressor layer in contact with the second fin structure has a rounded convex shape toward the first fin structure.

16. The semiconductor device of claim 15, wherein an upper surface of the isolation insulating layer between the first fin structure and the second fin structure has a rounded convex shape toward the substrate.

17. The semiconductor device of claim 16, wherein the first and second source/drain stressor layers are in contact with the isolation insulating layer.

18. The semiconductor device of claim 16, wherein a lowest portion of the rounded convex shape of the first and second source/drain stressor layers is located below a lowest portion of the rounded convex shape of the isolation insulating layer.

19. The semiconductor device of claim 15, wherein the first and second source/drain stressor layers include at least one of SiP, SiC and SiCP.

20. The semiconductor device of claim 15, wherein the first and second source/drain stressor layers includes SiGe.

* * * * *